United States Patent
Tsai et al.

[11] Patent Number: 5,866,481
[45] Date of Patent: Feb. 2, 1999

[54] SELECTIVE PARTIAL CURING OF SPIN-ON-GLASS BY ULTRAVIOLET RADIATION TO PROTECT INTEGRATED CIRCUIT DICE NEAR THE WAFER EDGE

[75] Inventors: Chia-Shiung Tsai, Shuang-Hsi Village; Pin-Nan Tseng, Hsin-chu; Sung-Mu Hsu, I-Lan, all of Taiwan

[73] Assignee: Taiwan Semiconductor Manufacturing Company Ltd., Hsin-Chu, Taiwan

[21] Appl. No.: 660,305

[22] Filed: Jun. 7, 1996

[51] Int. Cl.[6] .................................................. H01L 21/00
[52] U.S. Cl. ............................................ 438/694; 438/756
[58] Field of Search ....................... 156/625.1; 438/694, 438/756

[56] References Cited

U.S. PATENT DOCUMENTS

| | | | |
|---|---|---|---|
| 4,770,531 | 9/1988 | Tanaka et al. | 356/358 |
| 4,952,528 | 8/1990 | Abe et al. | 437/194 |
| 4,983,546 | 1/1991 | Hyun et al. | 437/231 |
| 5,125,748 | 6/1992 | Bjornson et al. | 356/414 |
| 5,194,976 | 3/1993 | Nakano et al. | 359/79 |
| 5,196,378 | 3/1993 | Bean et al. | 437/226 |
| 5,278,009 | 1/1994 | Iida et al. | 430/7 |
| 5,328,871 | 7/1994 | Tanigawa et al. | 438/694 |
| 5,426,503 | 6/1995 | Kusunose | 356/353 |
| 5,429,990 | 7/1995 | Liu | 437/190 |
| 5,448,336 | 9/1995 | Shiraishi | 355/71 |

*Primary Examiner*—Ceila Chang
*Attorney, Agent, or Firm*—George O. Saile; Stephen B. Ackerman

[57] ABSTRACT

This invention relates to a method for protecting regions of a spin-on-glass(SOG) layer, which covers usable semiconductor dice, from dissolution damage during an etch step which removes SOG along the wafer edge. The endangered dice have portions which lie in the area affected by the edge rinse. Instead of performing the edge etching step immediately after the deposition of the SOG, the endangered dice are first selectively partially cured by exposure to ultraviolet radiation. This makes the SOG over these dice resistant to the SOG solvent used for the edge rinse. Up to ten percent of the total usable dice on the wafer can be salvaged by the method of this invention.

15 Claims, 2 Drawing Sheets

SELECTIVE PARTIAL CURING OF SPIN-ON-GLASS BY ULTRAVIOLET RADIATION TO PROTECT INTEGRATED CIRCUIT DICE NEAR THE WAFER EDGE

BACKGROUND OF THE INVENTION (1) Field of the Invention

This invention relates to the manufacture of integrated circuit devices and more particularly to application and processing of spin-on-glasses.

(2) Description of prior art

The manufacture of large scale integrated circuits in a mass production facility involves hundreds of discrete processing steps beginning with the introduction of blank semiconductor wafers at one end and recovering the completed chips at the other. The manufacturing process is usually conceived as consisting of two segments The first is often referred to as front-end-of-line(FEOL) processing and includes those processing steps wherein the semiconductor devices are formed within the silicon surface. The second segment called back-end-of-line(BEOL) processing encompasses the formation of the various layers of interconnection metallurgy above the silicon surface. Depending on the complexity of the product and the circuit design as many as four layers of metallurgy may be required to provide the required circuit interconnections and connecting pads for the chips external connections.

The processing steps in BEOL involve depositing layers of material, patterning them by photolithographic techniques, and etching away the unwanted portions. The materials consist primarily of insulators and metal alloys.

Each time a layer of metallization is applied and circuit paths are etched within it, the next layer of insulation is preferred to flow into the contours of the metal pattern it is covering so as to render a smooth planar surface for the next metal layer. Most traditional film deposition techniques such as low-pressure-chemical-vapor-deposition(LPCVD), plasma-enhanced-chemical-vapor-deposition(PECVD), and rf sputtering cannot provide this desired surface planarization. These processes are more or less conformal and thereby replicate the topography upon which they are deposited. Only materials which can experience liquid flow during deposition are capable of providing such a planar upper surface. To this end low melting glasses such as phosphosilicate glass(PSG) can be deposited by LPCVD or PECVD and then caused to flow at elevated temperatures. However, because of the temperatures required for adequate flow, they have only found use prior to the deposition of the first layer of metallization.

Other alternatives comprise materials that can be applied in liquid form and subsequently hardened or cured to form solid insulating layers. In this category are photoresists, polyimides, and spin-on-glasses (SOG). The photoresists and polyimides remain as hardened organic materials after curing. The SOGs consist of alcohol soluble silicates and siloxanes which can attain the properties of inorganic glasses when properly cured. The SOGs have found wide acceptance in recent sub-micron semiconductor processing technology because of their low defect density, simplified processing, and low thermal budget. However, the SOG layers are limited to thicknesses of only a few thousand Angstroms. Thicker layers tend to crack and require longer curing times.

A common method of usage is to first deposit a layer of PECVD silicon oxide over the layer of patterned metallization and then lay the SOG over it. The SOG fills in the narrow features. It is then etched back by anisotropic etching to the PECVD oxide surface. The result is the original PECVD layer with the small spacings filled with SOG.

The SOG is deposited by a nozzle directed at the center of a rapidly spinning wafer. Centrifugal force distributes the liquid over the wafer. Excess liquid is flung from the edge of the wafer. The apparatus used to perform this task is of the same type that is conventionally used to deposit photoresist. The wafer is then allowed to dry. This method of application results in a layer that is somewhat thicker at the outer edge of the wafer. During the subsequent RIE etch back step, a circular clamp is used hold the wafer in place. This clamp shields a portion of the SOG preventing its removal during the etch back procedure. If this material is not removed prior to the etch back, it can crack during or after the SOG etch back thereby releasing particulate contamination.

In order to remove this edge band of SOG, an edge rinse with isopropyl alcohol(IPA) is performed prior to curing. The wafer is spun on the apparatus used to apply the SOG. The IPA is applied by a nozzle directed at the wafer edge. IPA effectively removes sufficient SOG from the edge region but in doing so tends to attack the SOG on portions of usable dice lying in close proximity to the wafer edge. These dice, which lie within the manufacturing process edge tolerance but are partly exposed to the IPA edge rinse would normally be lost.

SUMMARY OF THE INVENTION

It is therefore an object of this invention to provide a method to protect regions of a spin-on-glass layer covering usable dice lying near the wafer edge, from attack by the IPA edge rinse. This goal is accomplished by selectively exposing the endangered dice to ultraviolet(UV) radiation. Such exposure causes a partial curing of the SOG over these dice and prevents its dissolution by IPA edge rinse. The endangered dice are first identified according to the wafer layout and then sequentially exposed to UV light using a standard wafer stepper. Since only a fraction of the dice on the wafer are involved, the total processing time per wafer is not excessive. After UV exposure the edge rinse is performed and the SOG receives a final curing prior to the SOG planarization etchback. Typically about ten percent of the total dice on the wafer can be salvaged by this method.

DESCRIPTION OF THE PREFERRED EMBODIMENTS

Accordingly, in a typical embodiment of this invention, a silicon wafer is provided. The wafer, at the insertion of this invention, has been processed in an integrated circuit manufacturing line to a point where discrete semiconductor devices have been incorporated into its surface.

Figure 1:
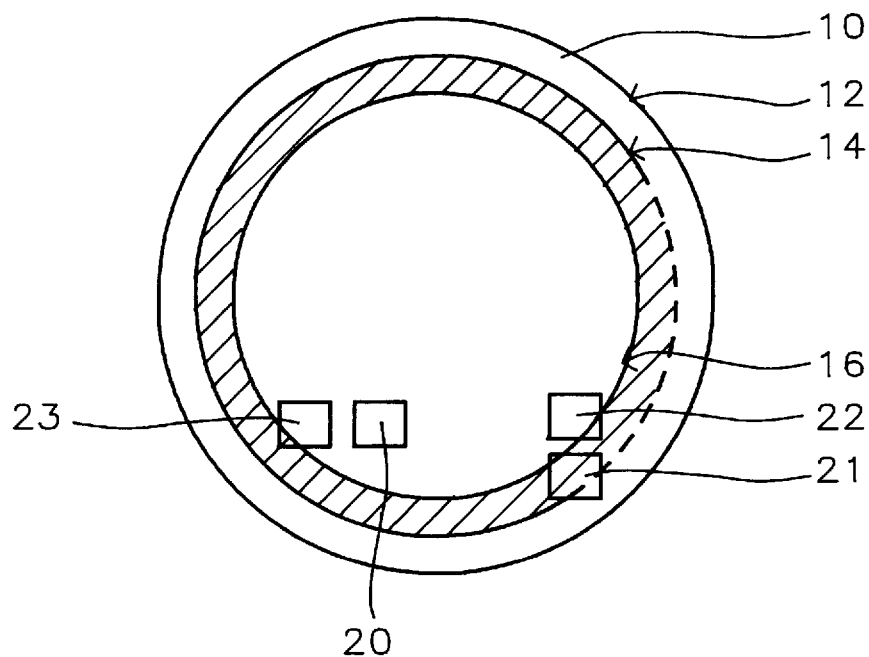
FIG. 1 show a portion of a wafer map indicating dice near the wafer edge.

The integrated circuit devices are located within discrete units identified as chips or dice. Each chip or die contains the devices and circuits which will constitute a discrete manufactured product. The dice are arranged in a fashion, on the wafer, to provide a maximum number of good dice of final product. This organization is commonly identified by a wafer map. Referring first to FIG. 1, a partial wafer map is depicted showing only example dice at various locations near the edge 12 of wafer 10. For the purpose of this commentary, two imaginary concentric circles are defined. Circle 14 represents the edge tolerance of the wafer. This is a quantity defined by the manufacturing ground rules and declares that any die which extends outside of circle 14 is not useable. A typical edge tolerance for these processes and wafer sizes is between 3.0 and 3.5 mm. The circle 16 represents a distance in from the edge of the wafer where SOG can be affected by the edge rinse step. This nominally extends about 7 mm in from the wafer edge 12. Dice which have portions extending into the shaded region between circle 14 and circle 16 but not into the edge tolerance region are identified as those endangered dice which this invention addresses. In FIG. 1 Die 21 is not included since it lies partially within the edge tolerance region. Dice 22 and 23 are identified as endangered by the edge rinse and can be protected by this embodiment. Die 20 is a good die but is not endangered by the edge rinse.

Figure 2:
FIG. 2 is an exaggerated cross section of a wafer showing the thicker SOG layer at the wafer edges.
Figure 3:
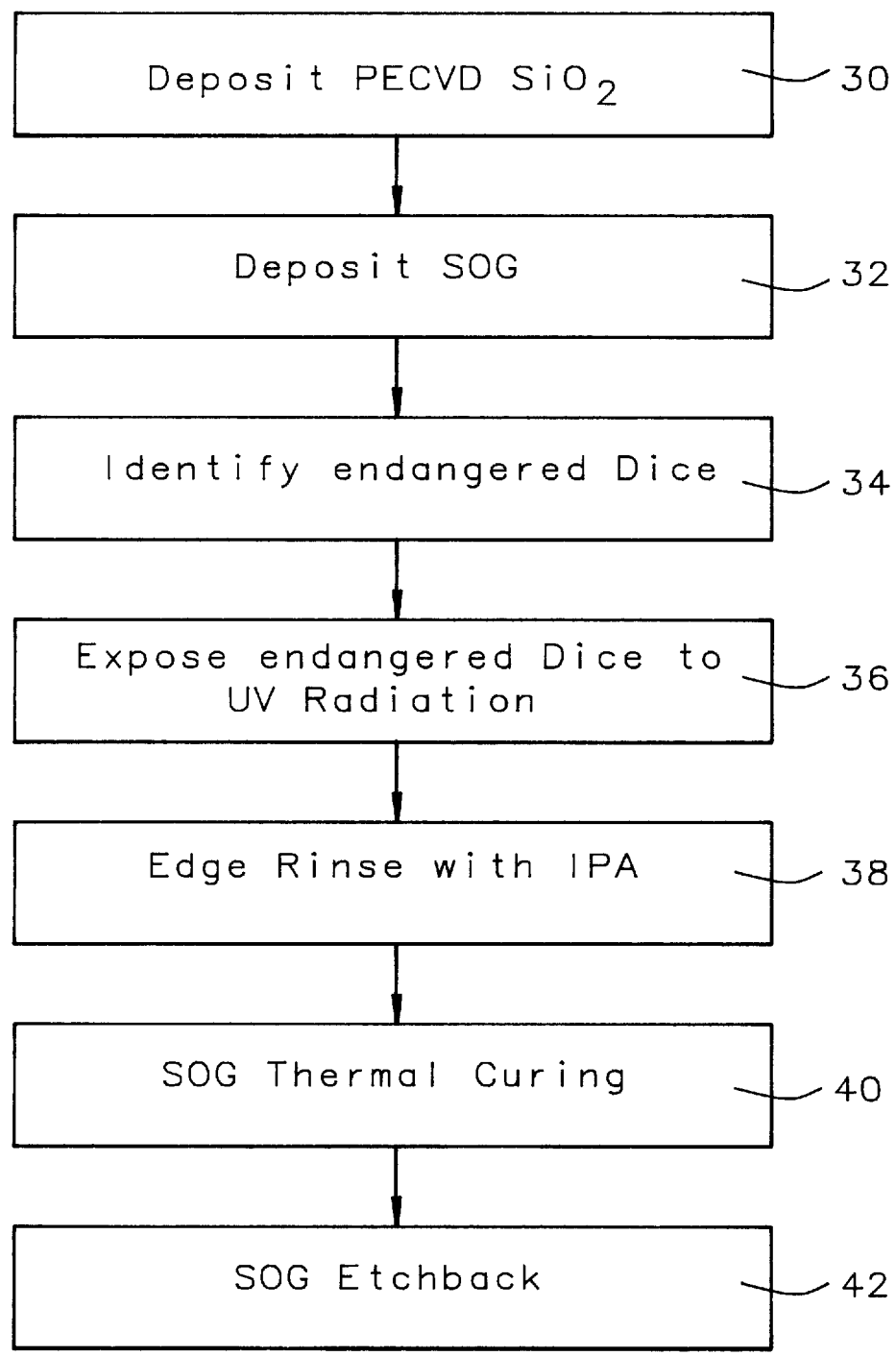
FIG. 3 gives a flow chart of the process of the invention.

After the devices have been formed within the wafer surface, a layer of silicon oxide, phosphosilicate glass or borophosphosilicate glass is deposited by PECVD. Contact openings are etched into the glass to expose the device contacts. Contact metallization is deposited and in some cases tungsten plugs are provided. Next a first layer of interconnection metallization is deposited by sputtering an aluminum-silicon-copper alloy over the wafer. Interconnection lines are defined by standard photolithographic techniques and the excess metal is etched away by reactive-ion-etching(RIE). Next, following the steps shown in FIG. 3, a second insulating layer of PECVD silicon oxide 30 between 2,000 and 3,000 Angstroms thick is deposited using tetraethoxyorthosilicate(TEOS)at a temperature of 300° C. to 500° C. This layer is conformal with the underlying metallization topography and its outer surface replicates the uneven topology of the surface below. A layer of spin-on-glass(SOG), between 3,000 and 6,000 Angstroms thick, is then applied using a commercial wafer spinning apparatus with a adjustable spin rate and a dispensing nozzle located above the wafer center 32. The SOG consists of a silicate or siloxane dissolved in an alcohol based solvent. The liquid fills in the underlying topology and its upper surface approaches planarity. As applied, the overall thickness of the SOG layer is uniform across the wafer but tends to be slightly thicker at the very edge. FIG. 2 shows an exaggerated cross section of a wafer 10 with an SOG layer 50. The thicker portion of the SOG layer extends up to 7 mm. in from the wafer edge.

The wafer is next mounted on a stepper within the UV exposure tool. The stepper is programmed to selectively expose only those dice which have been identified as endangered by the IPA rinse 34.

Following exposure, the wafer is removed from the stepper and placed on a commercial wafer spinning tool. The liquid application nozzle of the tool positioned to direct a stream of IPA at the edge of the spinning wafer. IPA is applied 38 and the liquid containing the dissolved SOG is flung from the edge of the wafer by centrifugal force. The dies which have been exposed to the UV partial curing retain their SOG coating.

After the edge rinse the remaining SOG is given a final cure 40 which is typically done in an oven at between 400° C. and 450° C. in a nitrogen ambient.

The wafer is next placed into an RIE tool and clamped in position by a circular clamp which covers a region about 2.25 mm. in from the wafer edge. The SOG in the circular region under the clamp has been removed by the IPA edge rinse. The tool is evacuated and the RIE planarization etch back is performed in the prescribed manner 42. The dice which were UV exposed lie external to the clamp and experience the etch back operation with their full complement of SOG.

While this invention has been particularly shown and described with reference to the preferred embodiments thereof, it will be understood by those skilled in the art that various changes in form and details may be made without departing from the spirit and scope of the invention.

What is claimed is:

1. A method for preparing an SOG layer on a silicon wafer for planarization etchback comprising:

providing a semiconductor wafer having devices formed in an arrangement of integrated circuit dice;

depositing an insulative layer over said wafer;

depositing an SOG layer on said insulative layer whereby a swollen band of SOG is formed along the edge of said wafer;

identifying as endangered dice those whole dice within said arrangement which lie entirely internal to a first circular band of said semiconductor wafer surface, said first circular band being defined by a wafer edge tolerance which extends from the wafer edge inward to between about 3.0 and 3.5 mm. from the wafer edge, and have at least a portion of their area within a second circular band of said semiconductor wafer surface lying between the inner perimeter of said first circular region and extending to about 7 mm. from the wafer edge, said second circular band defining a region of access by said edge rinse;

sequencially exposing selected endangered dice to radiation by a photolithographic stepper whereby said exposing renders said endangered regions resistant to said edge rinse;

performing said edge rinse after said exposing, thereby removing said swollen band;

curing said SOG layer after said edge rinse; and performing said planarization etchback.

2. The method of claim 1 wherein said SOG layer is selected from the group consisting of a silicate, and a siloxane.

3. The method of claim 1 wherein said edge rinse utilizes isopropyl alcohol as a solvent.

4. The method of claim 1 wherein said planarization etchback comprises a partial etch back of said SOG layer by RIE.

5. The method of claim 1 wherein said SOG layer is cured in an oven at between 400° C. and 450° C. in a nitrogen ambient.

6. The method of claim 1 wherein said planarization etchback comprises a full etch back of said SOG layer by RIE.

7. A method for selectively protecting discrete regions of a radiation sensitive material on a wafer from dissolution by an edge rinse in preparation of said layer for RIE planarization etchback comprising:

providing a wafer having a layer of radiation sensitive material;

identifying those regions of said layer which are to be protected from said edge rinse as endangered regions;

selectively exposing said endangered regions to radiation with a photolithographic stepper whereby said exposing renders said endangered regions resistant to said edge rinse;

performing said edge rinse after said exposing; and curing said layer.

8. The method of claim 7 wherein said layer is a spin-on-glass selected from the group consisting of a silicate, and a siloxane.

9. The method of claim 7 wherein said layer is a an organic coating selected from the group consisting of a polyimide, and a photoresist.

10. The method of claim 7 wherein the radiation type is selected from the group consisting of UV, deep UV, X-ray, and electron beam.

11. The method of claim 8 wherein said edge rinse is isopropyl alcohol.

12. The method of claim 9 wherein said edge rinse is a photoresist stripper.

13. The method of claim 7 wherein said edge rinse is applied by a wafer spinner.

14. The method of claim 1 wherein said edge rinse is applied by a wafer spinner.

15. The method of claim 7 wherein said curing is accomplished in an oven at between 400° C. and 450° C. in a nitrogen ambient.

\* \* \* \* \*